US005444324A

United States Patent [19]

Priest et al.

[11] Patent Number: 5,444,324

[45] Date of Patent: Aug. 22, 1995

[54] MECHANICALLY AMPLIFIED PIEZOELECTRIC ACOUSTIC TRANSDUCER

[75] Inventors: John F. Priest, Tomball; Mathew G. Schmidt, Houston, both of Tex.

[73] Assignee: Western Atlas International, Inc., Houston, Tex.

[21] Appl. No.: 279,944

[22] Filed: Jul. 25, 1994

[51] Int. Cl.[6] ............ H01L 41/08

[52] U.S. Cl. ............ 310/334; 310/328

[58] Field of Search ............ 310/328, 334

[56] References Cited

U.S. PATENT DOCUMENTS

| | | | |
|---|---|---|---|
| 2,386,279 | 10/1945 | Tibbetts | 310/334 |
| 2,416,887 | 3/1947 | Tibbetts | 310/334 |
| 2,487,962 | 11/1949 | Arndt, Jr. | 171/327 |
| 2,836,738 | 5/1956 | Crownover | 310/334 |
| 2,961,554 | 11/1960 | Cook et al. | 310/358 |
| 3,076,903 | 2/1963 | Schwartz | 310/328 |
| 3,287,692 | 11/1966 | Turner | 310/334 |
| 3,786,202 | 1/1974 | Schafft | 179/110 A |
| 4,035,672 | 7/1977 | Beaverson et al. | 310/348 |
| 4,047,060 | 9/1977 | Schafft | 310/322 |
| 4,382,203 | 5/1983 | Tribby et al. | 310/355 |
| 4,473,721 | 9/1984 | Klein | 179/110 A |
| 4,524,295 | 6/1985 | Allensworth et al. | 310/328 |
| 4,641,054 | 2/1987 | Takahata et al. | 310/324 |
| 4,742,499 | 5/1988 | Butler | 367/155 |
| 4,751,419 | 6/1988 | Takahata | 310/324 |
| 4,964,106 | 10/1990 | Bromfield | 367/165 |
| 5,001,681 | 3/1991 | Bertoldi et al. | 367/160 |
| 5,030,873 | 7/1991 | Owen | 310/334 |
| 5,036,245 | 7/1991 | Ohnishi et al. | 310/323 |
| 5,185,549 | 2/1993 | Sullivan | 310/334 |
| 5,191,252 | 3/1993 | Sano | 310/328 |
| 5,196,755 | 3/1993 | Shields | 310/324 |
| 5,245,669 | 9/1993 | Brittencourt | 381/184 |

FOREIGN PATENT DOCUMENTS

| | | | |
|---|---|---|---|
| 0854856 | 11/1952 | Germany | 310/334 |
| 0140946 | 4/1980 | Germany | 310/328 |
| 0210171 | 10/1985 | Japan | 310/328 |
| 0535114 | 12/1976 | U.S.S.R. | 310/328 |

*Primary Examiner*—Thomas M. Dougherty
*Attorney, Agent, or Firm*—Richard A. Fagin

[57] ABSTRACT

The invention is an apparatus for increasing the signal amplitude of a piezoelectric acoustic transducer. A piezoelectric actuator is affixed to an arched spring which changes arched height in response to change in length of the actuator. The spring drives a rigid surface which can be directly coupled to a material which is to be acoustically energized. In a particular embodiment of the invention, the rigid surface is coupled to an hydraulic transmission. The output of the transmission is coupled to the material which is to be acoustically energized.

10 Claims, 4 Drawing Sheets

MECHANICALLY AMPLIFIED PIEZOELECTRIC ACOUSTIC TRANSDUCER

BACKGROUND OF THE INVENTION

1. Field of the Invention

The present invention is related to the field of electro-acoustic transducers. More specifically, the present invention is related to the use of piezoelectric actuators to convert electrical energy to acoustic energy.

2. Description of the Related Art

Electro-acoustic transducers have numerous applications. Among these applications is the use of electro-acoustic transducers in acoustic wireline well logging tools.

Acoustic logging tools are typically used in evaluation of earth formations penetrated by a wellbore. The acoustic logging tool generally is adapted to traverse the wellbore while the tool is being conveyed by a wireline or cable. The tool comprises at least one transducer which converts electrical energy into acoustic energy, and a transducer which converts acoustic energy into an electrical signal which can be processed by circuits in the tool, or transmitted along the cable to processing equipment located at the earth's surface. The transducer which converts the acoustic energy into an electrical signal can either be the same or a different transducer than the transducer which converts electrical energy into acoustic energy. Operation of the tool typically includes the following sequence of events: an electrical energy pulse is sent to the transducer from a circuit in the tool, where it is converted into an acoustic energy pulse; the acoustic energy pulse travels through the wellbore and strikes the earth formation; some of the acoustic energy pulse is returned to the tool by direct reflection and some of the pulse is returned to the tool by internal refraction along the wall of the wellbore; some of the energy returned to the tool is converted by a transducer, which can be the same transducer which emitted the pulse, depending on the type of tool, into an electrical signal; and the electrical signal is processed either by circuits in the tool or by a computer at the earth's surface into information which can be used to determine certain properties of the earth formation.

A common type of transducer operates on the piezoelectric principle. The transducer comprises a material which changes shape upon application of an electric field. Materials having this property are known in the art. Conversely, the application of pressure to the material, which can be applied by acoustic energy, changes the shape of the material, thereby generating a voltage. The voltage generated is precisely proportional to the amount of change in shape for any particular composition of piezoelectric material, which makes piezoelectric transducers desirable for use where precise proportionality in conversion from acoustic energy to electric energy is required.

Piezoelectric transducers are difficult to use because the amount of change in the shape of the transducer is small, even with a large voltage applied to the transducer. It is difficult, therefore, to generate large acoustic signals at low frequencies with a piezoelectric transducer. It is known in the art to combine or "stack" individual layers of the piezoelectric material to increase the voltage response to acoustic energy, but the stacked piezoelectric element may lack sufficient structural strength to acoustically energize the wellbore at very high signal amplitudes without mechanical failure.

It is an object of the present invention to provide a means for increasing the amplitude of an acoustic signal generated by a piezoelectric transducer upon application of electrical energy to the transducer.

SUMMARY OF THE INVENTION

The invention is an apparatus for increasing the amplitude of an acoustic signal generated by application of an electrical signal to a piezoelectric transducer. In one embodiment of the invention, an arched bowspring is attached at one end to one end of a piezoelectric actuator along the longest dimension of the piezoelectric actuator, and at the other end to the other end of the actuator. The bowspring is cooperatively coupled to a piston. The motion of the ends of the piezoelectric actuator is converted into motion of the arch of the bowspring in a direction perpendicular to the thickness of the piezoelectric actuator, whereby the change in thickness of the piezoelectric actuator is amplified into much larger motion of the piston.

In another embodiment of the invention, a stack of piezoelectric actuators formed by joining individual piezoelectric actuators along the thickness dimension of the individual actuators, is attached to the ends of an arched bowspring. A piston contacts the bowspring substantially in the center of the arch. Change in thickness of the individual actuators is multiplied into a change in length of the stack. The change in length of the stack is converted into a much longer motion of the arch in a direction parallel to the direction of the length of the stack.

In a particular embodiment of the invention, the piston is operationally coupled to one end of an hydraulic transmission. The other end of the hydraulic transmission is acoustically coupled to the wellbore.

DETAILED DESCRIPTION OF THE PREFERRED EMBODIMENT

Figure 1:
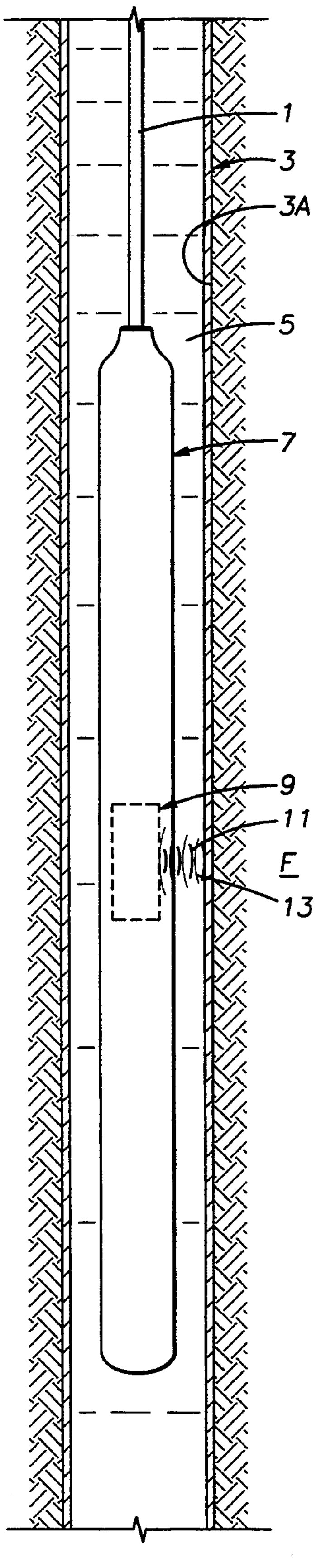
FIG. 1 shows a wireline acoustic well logging tool deployed in a wellbore. The tool has a single acoustic transducer that both emits an acoustic energy pulse and receives a reflection of the pulse from the wall of the wellbore.

FIG. 1 depicts the general operating environment of the invention when disposed within a wireline acoustic well logging tool. The tool 7 is lowered into a wellbore 3 by a cable 1 to a depth at which is located a formation F of interest. Within the tool 7 is an acoustic transducer 9 which periodically emits an acoustic energy pulse 11.

The pulse 11 travels through a fluid 5 filling the wellbore 3 and then strikes the wall 3A of the wellbore 3. Some of the pulse 11 is returned to the transducer 9 as a reflection 13. The reflection 13 contains information about the formation F which is processed in the tool 7 and transmitted up the cable 1 to the earth's surface for analysis.

Figure 2:
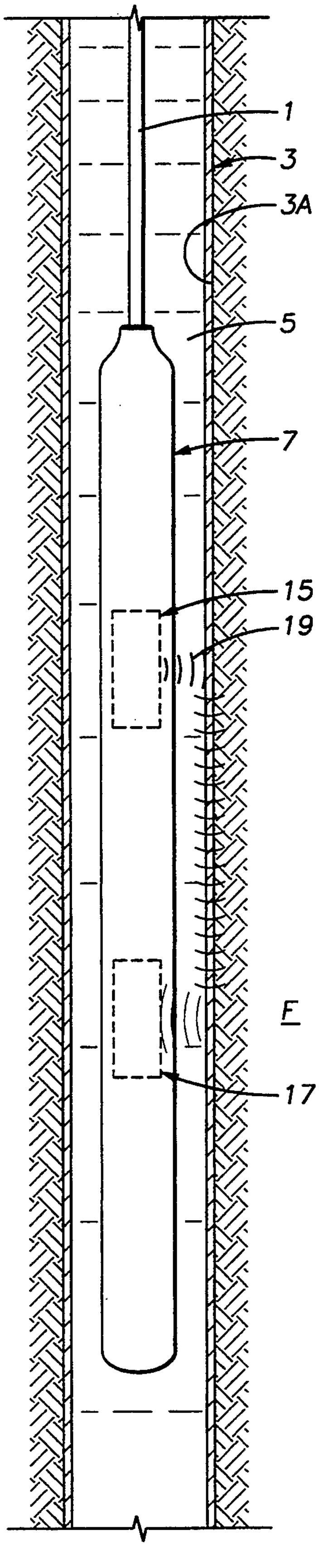
FIG. 2 shows the tool with more than one transducer. One transducer emits the pulse and another transducer receives the pulse after propagation along the wall of the wellbore.

FIG. 2 shows another typical configuration of acoustic well logging tool 7A. The tool 7A of FIG. 2 is lowered into a wellbore 3 filled with a fluid 5 similar to the tool 7 shown in FIG. 1. The tool 7A in FIG. 2A comprises at least two acoustic transducers 15, and 17. A first transducer 15 periodically emits an acoustic energy pulse 19 which travels through the fluid 5 filling the wellbore until the pulse 19 strikes the wellbore wall 3A. A portion of the pulse 19 is refracted along the wellbore wall 3A and reenters the fluid 5 filling the wellbore 3 in the vicinity of a second transducer 17. This portion of the pulse 19 continues through the fluid 5 until it is detected by the second transducer 17, whereupon the detected pulse 19 is processed in the tool 7A for transmission up the cable 1 for analysis at the earth's surface.

Figure 3:
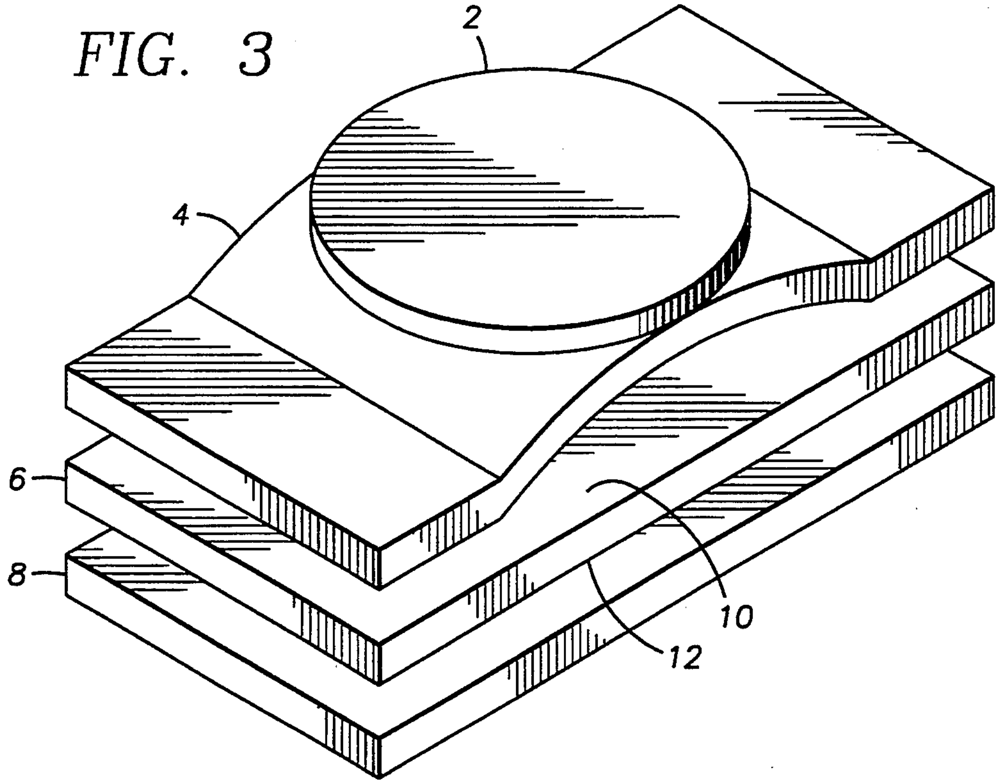
FIG. 3 shows the invention, comprising an arched spring bonded to an actuator, in detail.

FIG. 3 shows the transducer of the present invention in detail. A piezoelectric actuator 6 provides the acoustic energy for activating the transducer. In this embodiment the actuator 6 comprises a single piezoelectric element. The piezoelectric element is composed of a material that changes thickness upon application of an electrical voltage difference between an upper electrode 10 and a lower electrode 12. Application of the voltage difference reduces the thickness of the actuator 6 between the upper electrode 10 and lower electrode 12. Application of the voltage difference also expands the actuator 6 along the longest dimension perpendicular to the upper electrode 10 and lower electrode 12. An arched bowspring 4 is attached at one end to one end of the actuator 6, and at the other end to the other end of the actuator 6. The arched bowspring 4 can comprise a spring-steel plate having a length, when flat and fully extended, slightly longer than the actuator 6. Affixing the spring 4 at one end to one end of the actuator 6, and at the other end to the other end of the actuator 6 will form an arched shape in the spring 4. The spring 4 can be affixed to the actuator 6 with an adhesive compound. Application of the voltage difference to the actuator 6 will ultimately lengthen the actuator 6, and thereby lengthen the spring 4 which is affixed to the actuator 6. Lengthening the spring 4 will reduce the height of the arch in the spring 4. A piston 2 contacts the surface of the spring 4 opposite to the surface attached to the actuator 6. Changes in the height of the spring 4 will cause axial movement of the piston 2. The piston 2 can be coupled directly to the fluid (shown as 5 in FIG. 2) for acoustically activating the wellbore.

The actuator 6 also can generate an electrical voltage difference between the upper electrode 10 and lower electrode 12 when the actuator 6 is changed in length by application of a mechanical force to the ends of the actuator 6. Axial movement of the piston 2 caused by acoustic energy will effect a change in the arched height of the spring 4, which will change the length of the actuator 6, thereby generating an electrical voltage difference across the thickness of the actuator 6 proportional to the induced movement of the piston 2.

In a particular embodiment of the invention, a flat plate 8 can be affixed to the side of the actuator 6 opposite to the side of the actuator 6 to which the spring 4 is affixed. The flat plate 8 is composed of a rigid material, such as steel, and provides resistance to flexural distortion of the actuator 6 upon application of the voltage difference. The reduced flexural distortion of the actuator 6 increases energy transfer to the spring 4, and reduces the possibility of breakage of the actuator 6 by flexure.

DESCRIPTION OF ALTERNATIVE EMBODIMENTS

Figure 4:
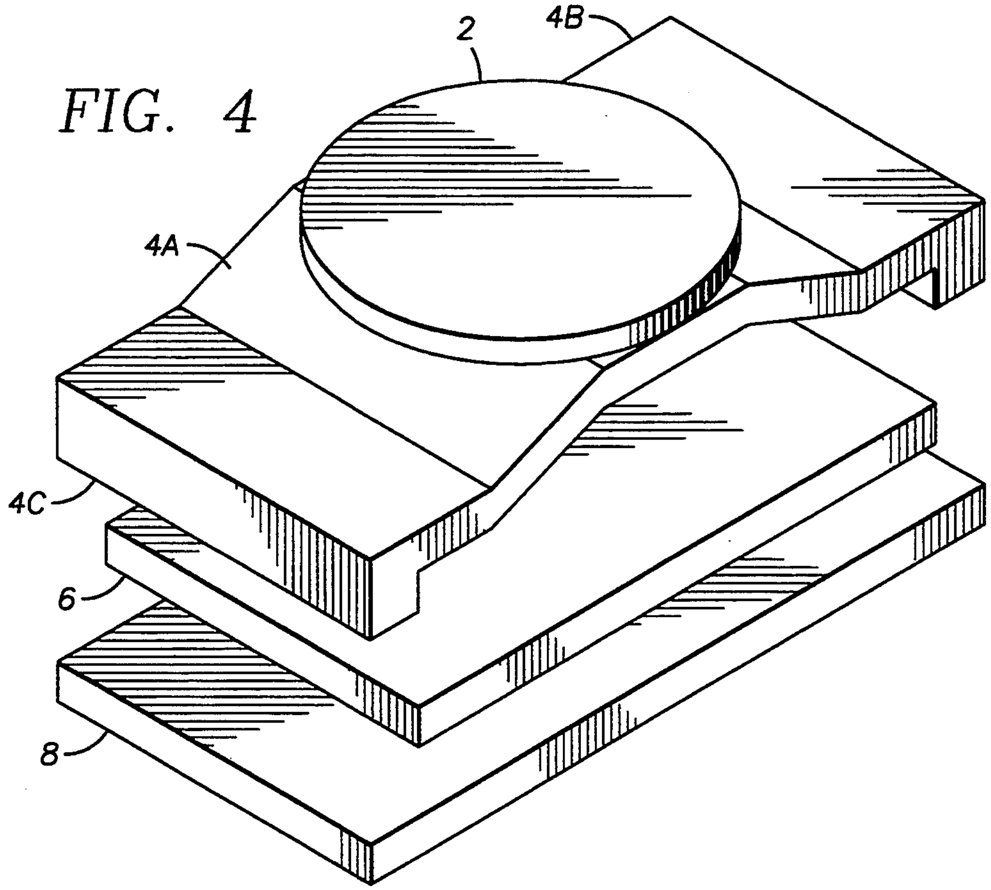
FIG. 4 shows the arched spring comprising end tabs for coupling motion of the ends of the actuator, and a flat plate for reducing flexural distortion of the actuator.

FIG. 4 shows an alternative method of affixing the spring 4A to the actuator 6. The spring 4A in FIG. 4 comprises shoulders 4B, 4C at each end which enclose the ends of the actuator 6, to restrain motion of the actuator 6. The addition of the shoulders 4B, 4C may reduce the possibility of failure of the adhesive compound affixing the ends of the spring 4A to the actuator 6.

Figure 5:
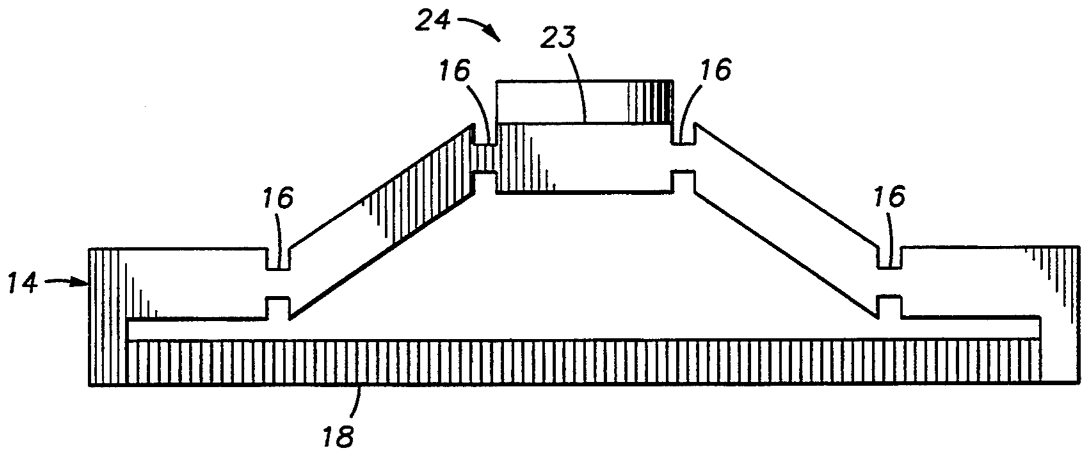
FIG. 5 shows the arched spring comprising flexure grooves.
Figure 6:
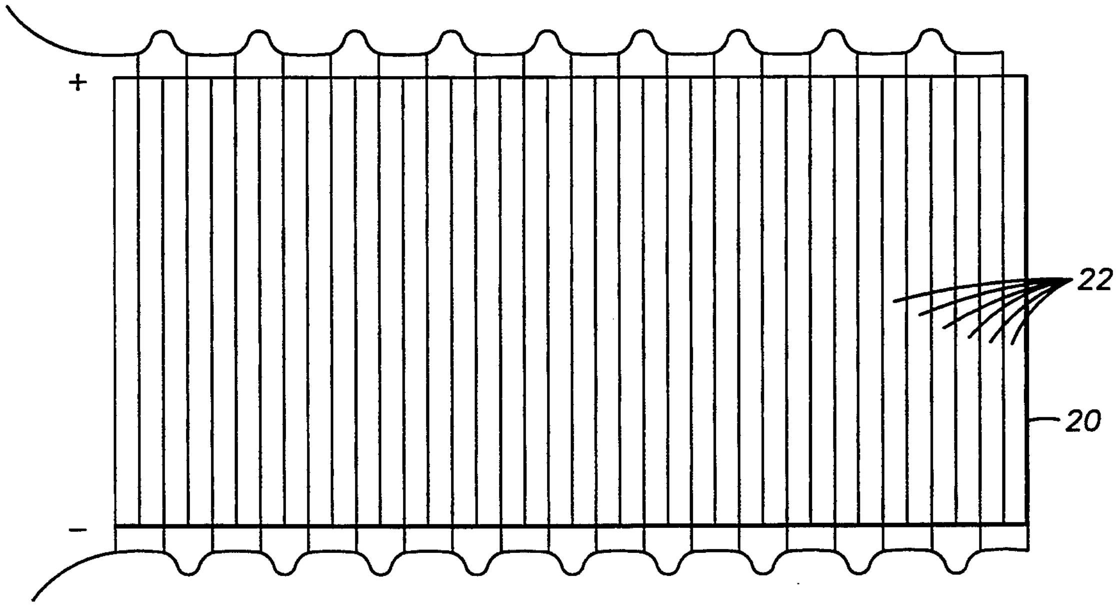
FIG. 6 shows the actuator comprising a stack of individual piezoelectric elements.

FIG. 5 shows an alternative spring 14 and an alternative actuator 18. The actuators of the previous embodiments comprises a single piezoelectric element. The actuator 18 of the present embodiment comprises a plurality of piezoelectric elements arranged in a stack. The individual piezoelectric elements are stacked along the smallest dimension of each element, also referred to as the thickness. The electrical voltage difference is applied across the thickness of the individual elements, changing the thickness of each element. The stacked elements each contribute to the overall change in dimension of the actuator 18. The change in overall dimension of the actuator 18 is the sum of the individual changes in thickness of the individual elements. FIG. 6 shows the arrangement of the individual elements 22 in the stack 20, and the manner in which the voltage difference is applied to the individual elements. Referring back to FIG. 5, the actuator 18 is affixed at each end to a spring 14. The spring 14 can be composed of plate steel which when fully extended and flat is slightly longer than the actuator 18. The spring 14 has flexure grooves 16, which are sections of reduced thickness, which can be formed into the spring 14 by milling, etching, stretching, or similar technique. Bending stress applied to the spring 14 by the actuator 16 is concentrated in the flexure grooves 16, which enables substantially linear movement of a portion 23 of the spring which contacts a piston 24. The face of the piston 24 opposite to the face in contact with the spring 14 contacts the fluid (shown as 5 in FIG. 2) in the wellbore (shown as 3 in FIG. 2).

Figure 7:
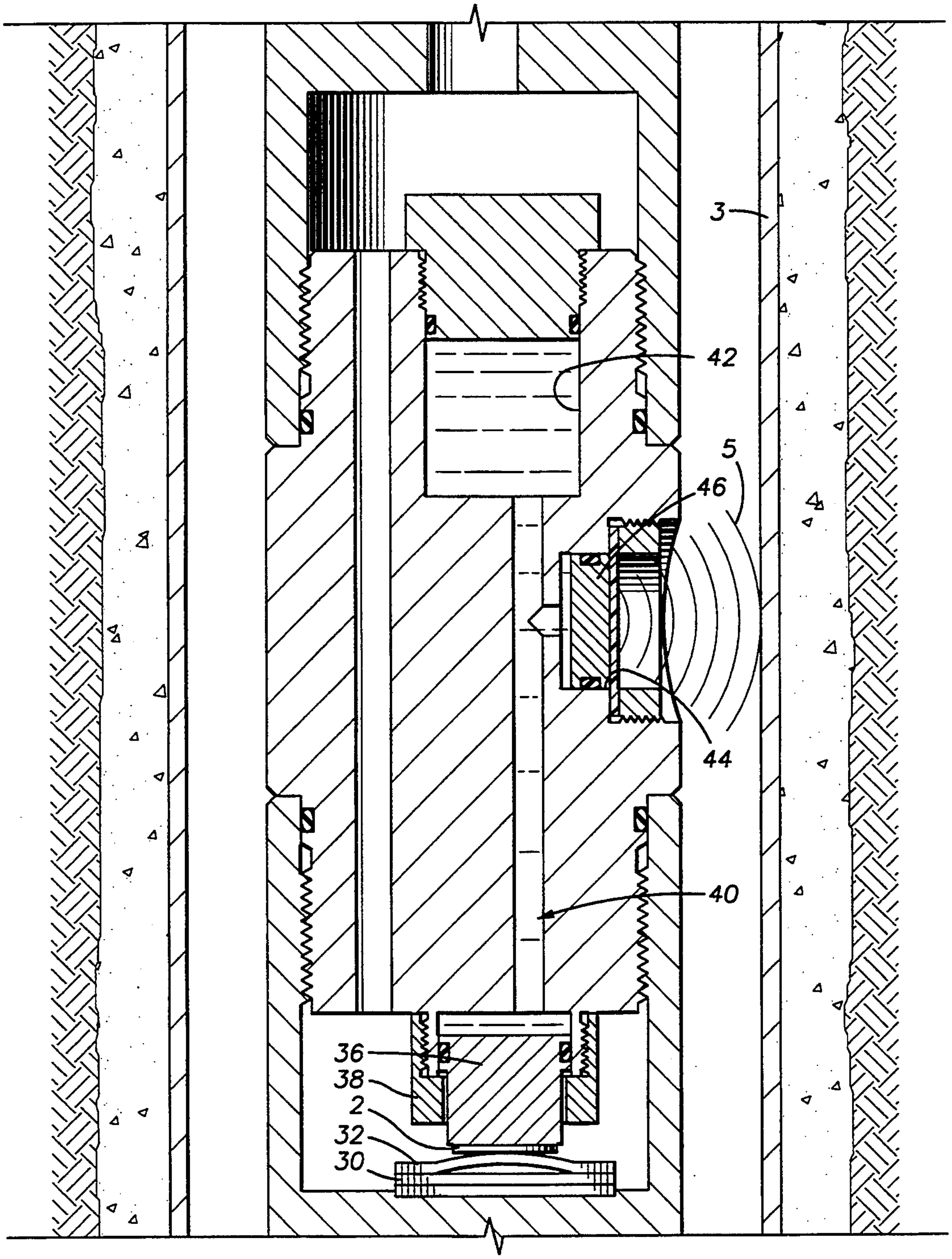
FIG. 7 shows the transducer of the invention coupled to an hydraulic transmission.

FIG. 7 shows an alternative means for acoustically coupling the piston 2 to the fluid 5 filling the wellbore 3, which is known as an hydraulic transmission. The piston 2, which as in the previous embodiments is activated by the spring 32 and actuator 30, contacts a drive disk 36 within a master cylinder 38. The master cylinder is connected hydraulically by lines 40 to an hydraulic reservoir 42 and a slave cylinder 44. The slave cylinder 44 comprises a driven disk 46 which directly contacts the fluid 5 filling the wellbore 3. Movement of the piston 2 is transmitted by displacement of the drive disk 36 to hydraulic fluid within the reservoir 42 and lines 40 to the driven disk 46. The system can also receive acoustic energy from the wellbore 3 by reversing operation, whereby acoustic energy arriving from the fluid 5 in the wellbore 3 moves the driven disk 44. The motion of the driven disk 44 is transmitted hydraulically to the drive disk 36, and thence to the piston 2, the spring 32, and the actuator 30, whereupon an electrical voltage difference will be generated by the actuator 30. Hydraulic coupling by the hydraulic transmission enables a single configuration of transducer to be coupled to the wellbore 3 with selectable amounts of mechanical amplification, the amplification depending on the cross-sectional areas of the drive disk 36 and driven disk 46.

I claim:

1. An apparatus for increasing the signal amplitude of a piezoelectric acoustic transducer comprising:

a piezoelectric actuator;

an arched spring affixed at one end to one end of said actuator and affixed at the other end to the other end of said actuator substantially perpendicularly to the thinnest dimension of said actuator;

a rigid surface, cooperatively coupled to said arched spring so that application of an electrical voltage to said actuator for changing the thickness of said actuator also changes the length of said actuator and the arched height of said arched spring, whereby said rigid surface is moved a substantially greater distance than the change in length of said actuator; and an hydraulic transmission interposed between said rigid surface and a material to be acoustically energized, whereby the movement of the rigid surface is transferred through the transmission to acoustically energize the material.

2. The apparatus as defined in claim 1 wherein said rigid surface comprises a piston in contact with said arched spring.

3. The apparatus as defined in claim 1 wherein said piezoelectric actuator comprises a single piezoelectric element.

4. The apparatus as defined in claim 1 wherein said piezoelectric actuator comprises a plurality of piezoelectric elements arranged in a stack, the length of said stack parallel to the shortest dimension of the individual piezoelectric elements in said plurality of piezoelectric elements, so that the change in the thickness of the individual piezoelectric elements resulting from application of an electrical voltage to said piezoelectric actuator is compounded in to a change in the length of said actuator parallel to the length of said stack.

5. The apparatus as defined in claim 1 further comprising an inflexible plate affixed to one side of said actuator, thereby substantially reducing flexural distortion of said actuator.

6. An apparatus for increasing the signal amplitude of a piezoelectric acoustic transducer comprising:

a piezoelectric actuator; and an arched spring including a plate longer than the piezoelectric actuator, the plate affixed substantially coterminally at one end to one end of the piezoelectric actuator, and affixed substantially coterminally at the other end to the other end of the actuator, the plate having flexure grooves formed into the surface of thereof, so that greater length of said plate is transposed into arched displacement of said plate away from said actuator between the ends of said actuator and said plate, whereby changing the length of the piezoelectric actuator will cause bending about the flexure grooves and move a rigid surface cooperatively engaging the plate substantially linearly a greater distance than the change in length of said actuator.

7. The apparatus as defined in claim 6 wherein said rigid surface comprises a piston in contact with said arched spring.

8. The apparatus as defined in claim 6 wherein said piezoelectric actuator comprises a single piezoelectric element.

9. The apparatus as defined in claim 6 wherein said piezoelectric actuator comprises a plurality of piezoelectric elements arranged in a stack, the length of said stack parallel to the shortest dimension of the individual piezoelectric elements in said plurality of piezoelectric elements, so that the change in the thickness of the individual piezoelectric elements resulting from application of an electrical voltage to said piezoelectric actuator is compounded in to a change in the length of said actuator parallel to the length of said stack.

10. The apparatus as defined in claim 6 further comprising an inflexible plate affixed to one side of said actuator, thereby substantially reducing flexural distortion of said actuator.

* * * * *